(12) United States Patent
Ayazi et al.

(10) Patent No.: US 8,519,598 B1
(45) Date of Patent: Aug. 27, 2013

(54) MICROELECTROMECHANICAL RESONATORS HAVING PIEZOELECTRIC LAYERS THEREIN THAT SUPPORT ACTUATION AND SENSING THROUGH A LONGITUDINAL PIEZOELECTRIC EFFECT

(75) Inventors: Farrokh Ayazi, Atlanta, GA (US); Roozbeh Tabrizian, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 263 days.

(21) Appl. No.: 13/175,870

(22) Filed: Jul. 3, 2011

Related U.S. Application Data

(60) Provisional application No. 61/408,787, filed on Nov. 1, 2010.

(51) Int. Cl.
  *H01L 41/047* (2006.01)
  *H01L 41/053* (2006.01)
  *H01L 41/09* (2006.01)
  *C03C 25/68* (2006.01)

(52) U.S. Cl.
  USPC ........... 310/320; 310/351; 310/363; 310/365; 310/367; 216/47

(58) Field of Classification Search
  USPC ................. 310/320, 321, 363, 367, 370, 351, 310/365; 216/2, 47
  See application file for complete search history.

(56) References Cited

U.S. PATENT DOCUMENTS

| | | | | | |
|---|---|---|---|---|---|
| 2,271,200 | A | * | 1/1942 | Mason | 333/192 |
| 2,565,158 | A | * | 8/1951 | Williams | 310/328 |
| 2,955,216 | A | * | 10/1960 | Dieter, Jr. | 310/330 |
| 3,369,200 | A | * | 2/1968 | Hans et al. | 333/197 |
| 4,836,023 | A | * | 6/1989 | Oikawa | 73/504.14 |
| 7,176,770 | B2 | | 2/2007 | Ayazi et al. | |
| 7,639,105 | B2 | | 12/2009 | Ayazi et al. | |
| 7,800,282 | B2 | | 9/2010 | Ayazi et al. | |
| 7,834,526 | B2 | * | 11/2010 | Yamada | 310/367 |
| 7,843,284 | B2 | | 11/2010 | Ayazi et al. | |
| 7,888,843 | B2 | | 2/2011 | Ayazi et al. | |
| 7,898,158 | B1 | * | 3/2011 | Li et al. | 310/351 |
| 7,924,119 | B1 | | 4/2011 | Ayazi et al. | |
| 7,939,990 | B2 | | 5/2011 | Wang et al. | |

OTHER PUBLICATIONS

Pan W. and Ayazi F., "Thin-Film Piezoelectric-On-Substrate Resonators with Q Enhancement and TCF Reduction", $23^{rd}$ IEEE International Conference on Micro Electro Mechanical Systems (MEMS 2010), p. 727-730.

(Continued)

*Primary Examiner* — Thomas Dougherty
(74) *Attorney, Agent, or Firm* — Myers Bigel Sibley & Sajovec, P.A.

(57) ABSTRACT

Microelectromechanical resonators include a resonator body having a first piezoelectric layer on a upper surface thereof, which is configured to support actuation and sensing through a transverse piezoelectric effect ($e_{31}$), and a second piezoelectric layer on at least a portion of a first sidewall thereof, which is configured to support actuation and sensing through a longitudinal piezoelectric effect ($e_{33}$), where $e_{33}$ is greater than $e_{31}$. These resonators may further include a first bottom electrode extending between the first piezoelectric layer and the upper surface of the resonator body and a second bottom electrode extending between the second piezoelectric layer and the first sidewall of the resonator body. These first and second bottom electrodes may be contiguous as a single bottom electrode and the first and second piezoelectric layers may be contiguous as a single piezoelectric layer.

18 Claims, 5 Drawing Sheets

(56) References Cited

OTHER PUBLICATIONS

Tabrizian R. and Ayazi F., "Laterally-Excited Silicon Bulk Acoustic Resonators With Sidewall ALN", 16$^{th}$ International Conference on Solid-State Sensors, Actuators and Microsystems (Transducers 2011), Beijing, China, Jun. 2011, pp. 1520-1523.

Tabrizian R. and Ayazi F., "Tunable Silicon Bulk Acoustic Resonators with Multi-Face AlN Transduction", Joint Conference of the IEEE International Frequency Control Symposium & European Frequency and Time Forum (IFCS/EFTF 2011), San Francisco, CA, May 2011, 4 pages.

Tabrizian et al. (2011) "Laterally-Excited Silicon bulk Acoustic Resonators With Sidewall ALN", Unpublished paper presented at IFCS 2011, CA, USA and Transducers 2011, Beijing, China. 4 pages.

Tabrizian et al. (2011) "Tunable Silicon Bulk Acoustic Resonators with Multi-Face AlN Transduction", Unpublished paper presented at IFCS 2011, CA, USA and Transducers 2011, Beijing, China. 4 pages.

\* cited by examiner

MICROELECTROMECHANICAL RESONATORS HAVING PIEZOELECTRIC LAYERS THEREIN THAT SUPPORT ACTUATION AND SENSING THROUGH A LONGITUDINAL PIEZOELECTRIC EFFECT

REFERENCE TO PRIORITY APPLICATION

This application claims priority to U.S. Provisional Application Ser. No. 61/408,787, filed Nov. 1, 2010, the disclosure of which is hereby incorporated herein by reference.

FIELD OF THE INVENTION

The present invention relates to integrated circuit devices and, more particularly, to microelectromechanical resonator devices.

BACKGROUND OF THE INVENTION

Frequency references provided by oscillators are required in every clocked electronic system, including communication circuits, microprocessors, and signal processing circuits. Oscillators frequently consist of high performance piezoelectric crystals, such as quartz oscillators. The advantages of quartz oscillators are their stable operating frequency and high quality factor. However, the disadvantages of quartz oscillators are their relatively large size and unsuitability for high integration with electronic circuitry (e.g., CMOS circuits).

Based on these limitations of conventional oscillators, there is a strong interest in the development of fully integrated silicon oscillators. Integration is important not only for reduced size but also reduced power consumption. It is possible to realize an integrated silicon oscillator using the mechanical properties of silicon devices. For example, silicon microelectromechanical (MEMs) resonators can provide small form factor, ease of integration with conventional semiconductor fabrication techniques and high f•Q products. Accordingly, MEMs resonators are considered a desirable alternative to quartz resonators in real-time and other clock applications.

One category of MEMs resonators includes lateral-mode piezoelectric resonators, such as thin-film piezoelectric-on-silicon (TPoS) resonators. These resonators utilize piezoelectric transduction to achieve electromechanical coupling using the transverse piezoelectric coefficient $e_{31}$ of a planar piezoelectric layer, such as aluminum nitride (AlN). These types of resonators are disclosed in U.S. Pat. No. 7,939,990 to Wang et al., entitled "Thin-Film Bulk Acoustic Resonators Having Perforated Bodies That Provide Reduced Susceptibility to Process-Induced Lateral Dimension Variations," and in U.S. Pat. No. 7,888,843 to Ayazi et al., entitled "Thin-Film Piezoelectric-on-Insulator Resonators Having Perforated Resonator Bodies Therein," the disclosures of which are hereby incorporated herein by reference. An example of a high frequency vertical bulk acoustic resonator with a relatively large transduction area that utilizes capacitive coupling is disclosed in U.S. Pat. No. 7,176,770 to Ayazi et al., entitled "Capacitive Vertical Silicon Bulk Acoustic Resonator," the disclosure of which is hereby incorporated herein by reference.

Additional examples of MEMs resonators, which provide electromechanical coupling using the transverse piezoelectric coefficient $e_{31}$ of a planar piezoelectric layer and include active frequency tuning, are disclosed in U.S. Pat. Nos. 7,639,105 and 7,843,284 to Ayazi et al., entitled "Lithographically-Defined Multi-Standard Multi-Frequency High-Q Tunable Micromechanical Resonators," and in U.S. Pat. No. 7,924,119 to Ayazi et al., entitled Micromechanical Bulk Acoustic Mode Resonators Having Interdigitated Electrodes and Multiple Pairs of Anchor Supports," and in U.S. Pat. No. 7,800,282 to Ayazi et al., entitled Single-Resonator Dual-Frequency Lateral-Extension Mode Piezoelectric Oscillators, and Operating Methods Thereof," the disclosures of which are hereby incorporated herein by reference.

SUMMARY OF THE INVENTION

Microelectromechanical resonators according to embodiments of the invention may include a semiconductor resonator body having a first piezoelectric layer on a upper surface thereof, which is configured to support actuation and sensing through a transverse piezoelectric effect ($e_{31}$), and a second piezoelectric layer on at least a portion of a first sidewall thereof, which is configured to support actuation and sensing through a longitudinal piezoelectric effect ($e_{33}$), where $e_{33}$ is greater than $e_{31}$. These resonators may further include a first bottom electrode extending between the first piezoelectric layer and the upper surface of the resonator body and a second bottom electrode extending between the second piezoelectric layer and the first sidewall of the resonator body. These first and second bottom electrodes may be contiguous as a single bottom electrode and the first and second piezoelectric layers may be contiguous as a single piezoelectric layer. According to some embodiments of the invention, the single piezoelectric layer may be deposited as a sputtered aluminum nitride layer that extends on the upper surface and the sidewall of the resonator body. In some embodiments of the invention, the aluminum nitride layer may be deposited so that its C-axis is perpendicular to the first sidewall of the resonator body. Other piezoelectric materials include zinc oxide and lead zirconate titanate, for example According to further embodiments of the invention, a top electrode is provided on the upper surface and on the first sidewall of the resonator body, with the single piezoelectric layer extending between the top electrode and the bottom electrode. The resonator body may also be anchored on opposing ends thereof to a surrounding substrate by a pair of semiconductor tethers, which may be covered by the bottom electrode, the single piezoelectric layer and the top electrode Methods of forming microelectromechanical resonators according to embodiments of the invention may include forming a semiconductor resonator body and forming a bottom electrode on a pair of opposing sidewalls and on an upper surface of the resonator body. This resonator body may be formed as a resonator body that is anchored to a surrounding substrate by a pair of tethers. Portions of the bottom electrode on the sidewalls and the upper surface of the resonator body may be coated with a piezoelectric layer and a top electrode may be formed on the piezoelectric layer. In some of these embodiments of the invention, the step of forming a semiconductor resonator body may include patterning a semiconductor active layer of a semiconductor-on-insulator substrate by selectively etching the semiconductor active layer for a sufficient duration to expose an underlying buried insulating layer within the substrate. In addition, the step of forming a top electrode may be followed by a step of selectively removing a portion of the buried insulating layer extending underneath the resonator body to thereby cause the resonator body to be suspended over an opening in the buried insulating layer According to still further embodiments of the invention, a one-port microelectromechanical resonator may include a semiconductor resonator body anchored to a surrounding substrate by a pair of tethers. The resonator body has an upper surface and opposing sidewalls that are covered by a composite stack of a bottom electrode, a piezoelectric layer and an upper electrode. In addition, a first thickness of the piezoelectric layer on the sidewalls of the resonator body may be thinner than a second thickness of the piezoelectric layer on the upper surface of the resonator body. In particular, a portion of the piezoelectric layer on the upper surface of the resonator body may be configured to support actuation and sensing through a transverse piezoelectric effect and a portion of the piezoelectric layer on the sidewalls of the resonator body may be configured to support actuation and sensing through a longitudinal piezoelectric effect. The portion of the piezoelectric layer on the sidewalls of the resonator body may be configured so that a C-axis of the piezoelectric layer is perpendicular to a sidewall of the resonator body.

DETAILED DESCRIPTION OF EMBODIMENTS

Figure 1:
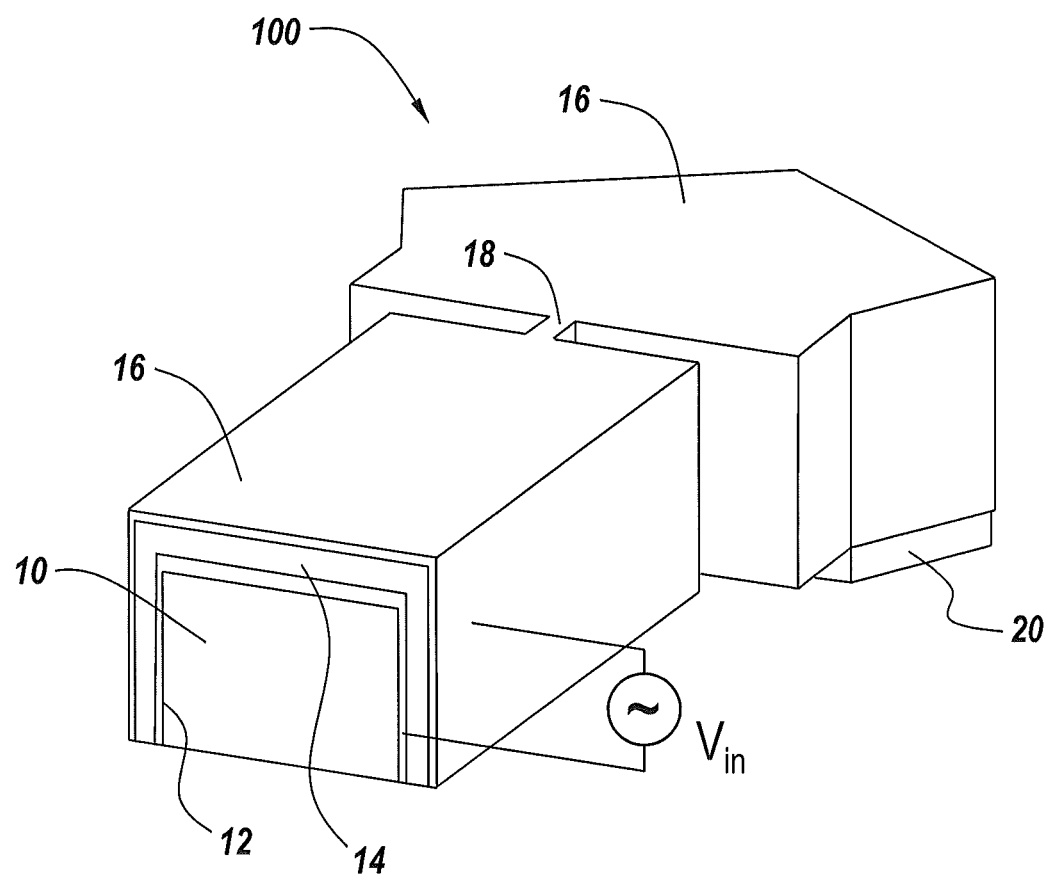
FIG. 1 is a perspective cross-sectional view of a microelectromechanical resonator according to an embodiment of the present invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Embodiments of the present invention are described herein with reference to cross-section and perspective illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a sharp angle may be somewhat rounded due to manufacturing techniques/tolerances.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a perspective cross-sectional view of a microelectromechanical bulk acoustic resonator 100 operable in a width-extensional mode, according to an embodiment of the present invention. As shown by FIG. 1, the resonator 100 includes a resonator body 10, a lower electrode 12 directly on sidewalls and an upper surface of the resonator body 10, a piezoelectric layer 14 on the lower electrode 12 and an upper electrode 16 on the piezoelectric layer 14. The resonator body 10 may be suspended opposite an opening in an underlying buried insulating layer 20, using a tether 18 that is covered by the upper electrode 16. According to some of these embodiments of the invention, the resonator body 10 may be formed from a patterned semiconductor layer, such as a patterned silicon active layer of a silicon-on-insulator (SOI) substrate having a buried insulating layer (e.g., oxide layer) extending between the silicon active layer and an underlying semiconductor substrate (e.g., silicon wafer). The lower and upper electrodes 12, 16 may also be formed as molybdenum layers and the piezoelectric layer 14 may be formed as an aluminum nitride layer. Alternatively, the piezoelectric layer 14 may be formed of a material selected from a group consisting of zinc oxide and lead zirconate titanate, however, other materials may also be used. This piezoelectric layer 14 is separated from the upper surface and sidewalls of the resonator body 10 by the lower electrode 12 in the illustrated embodiment. However, in alternative embodiments of the invention, piezoelectric layers may be provided on the sidewalls of the resonator body 10, but not on the upper surface of the resonator body 10.

Figure 2:
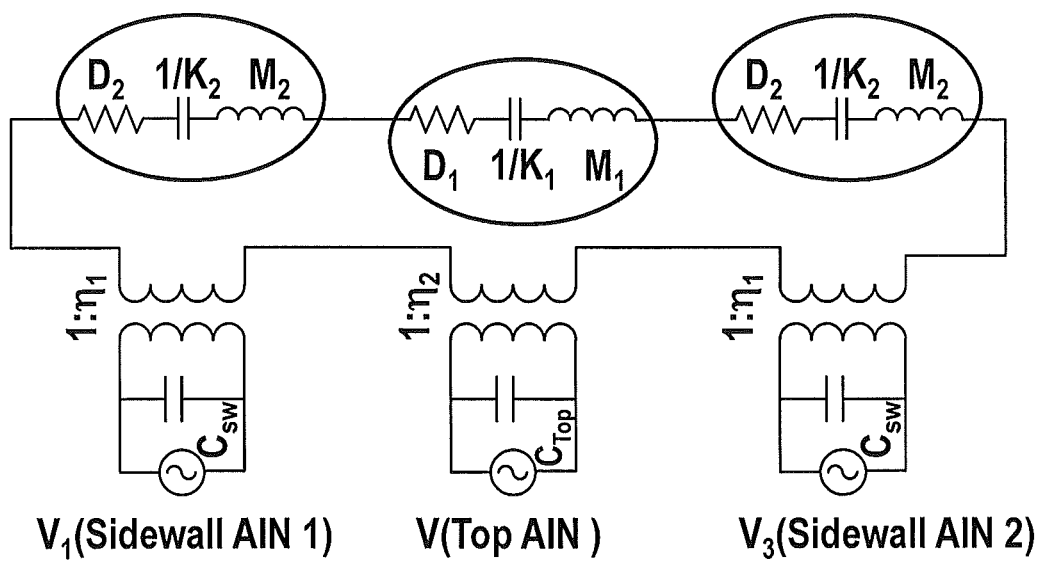
FIG. 2 is a simplified equivalent circuit model of the microelectromechanical resonator of FIG. 1.

Although not wishing to be bound by any theory, a portion of the piezoelectric layer 14 on an upper surface of the resonator body is configured to support actuation and sensing through a transverse piezoelectric effect ($e_{31}$), and portions of the piezoelectric layer 14 on the opposing sidewalls of the resonator body are each configured to support actuation and sensing through a longitudinal piezoelectric effect ($e_{33}$), where $e_{33}$ is greater than $e_{31}$. Based on this configuration, each of the top and sidewall portions of the aluminum nitride (AlN) piezoelectric layer may be modeled as separate electromechanical transducers, as illustrated by FIG. 2. In particular, FIG. 2 shows a simplified electrical equivalent circuit of the resonator 100 of FIG. 1 around its first width extensional mode. In this model, the three transformers represent the two piezoelectric transduction mechanisms with longitudinal ($\eta_1$) and transverse ($\eta_2$) coupling coefficients. This model is derived by considering three resonators acoustically coupled in series: two AlN thickness-mode resonators associated with the sidewalls of the resonator body and one AlN-on-SiBAR associated with the upper surface of the resonator body. As will be understood by those skilled in the art, the voltage sources $V_1$, $V_2$ and $V_3$ are shorted together to yield a one-port resonator whenever the top electrode (e.g., Mo electrode) is continuous over the sidewall and top surfaces of the resonator 100, as illustrated by FIG. 1. In the equivalent circuit of FIG. 2, $D_1$, $K_1$ and $M_1$ and $D_2$, $K_2$ and $M_2$ are equivalent damping, stiffness and mass of the SiBAR associated with the top AlN and sidewall AlN layer, respectively. In addition, $C_{SW}$ and $C_{Top}$ are the capacitances of the sidewall and top AlN layers, respectively. This model of FIG. 2 and the recognition that $|e_{33}| \approx 3|e_{31}|$ and $\eta_1 \gg \eta_2$ implies that actuation and sensing of the bulk acoustic resonance is much more efficient using piezoelectric layers on the sidewalls relative to the top surface. Accordingly, bulk acoustic resonators with sidewall piezoelectric transduction can be expected to provide considerably lower motional resistance than those otherwise equivalent devices providing only top surface piezoelectric actuation and sensing. Further discussions of these advantages are disclosed in a pair of articles by R. Tabrizian and F. Ayazi, entitled "Laterally Excited Silicon Bulk Acoustic Resonators with Sidewall AlN," 16th International Conference on Solid-State Sensors, Actuators and Microsystems (Transducers 2011), Beijing, China, June 2011, pp. 1520-1523; and "Tunable Silicon Bulk Acoustic Resonators with Multi-Face AlN Transduction," Joint Conference of the IEEE International Frequency Control Symposium & European Frequency and Time Forum (IFCS/EFTF 2011), San Francisco, Calif., May (2011), the disclosures of which are hereby incorporated herein by reference.

Figure 3A:
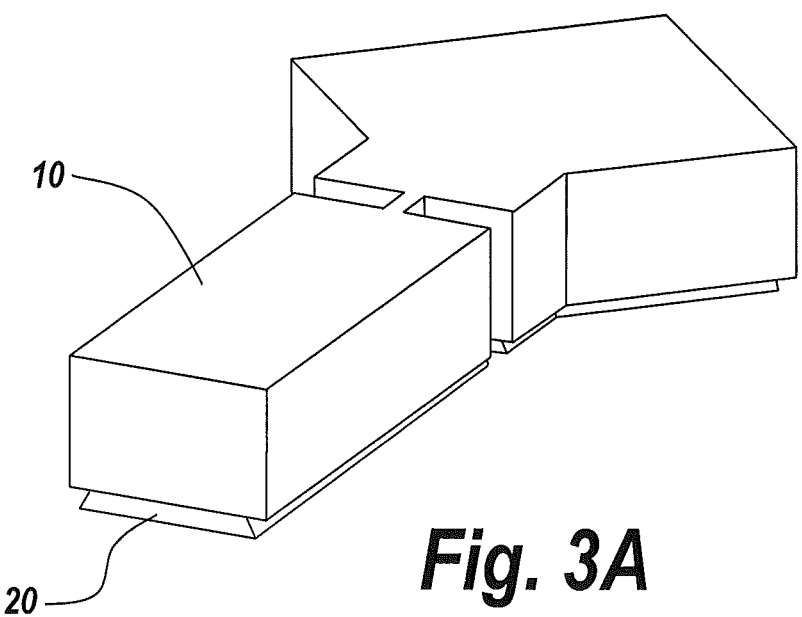
FIGS. 3a-3b are perspective cross-sectional views that illustrates methods of forming the microelectromechanical resonator of FIG. 1, according to embodiments of the invention.
Figure 3B:
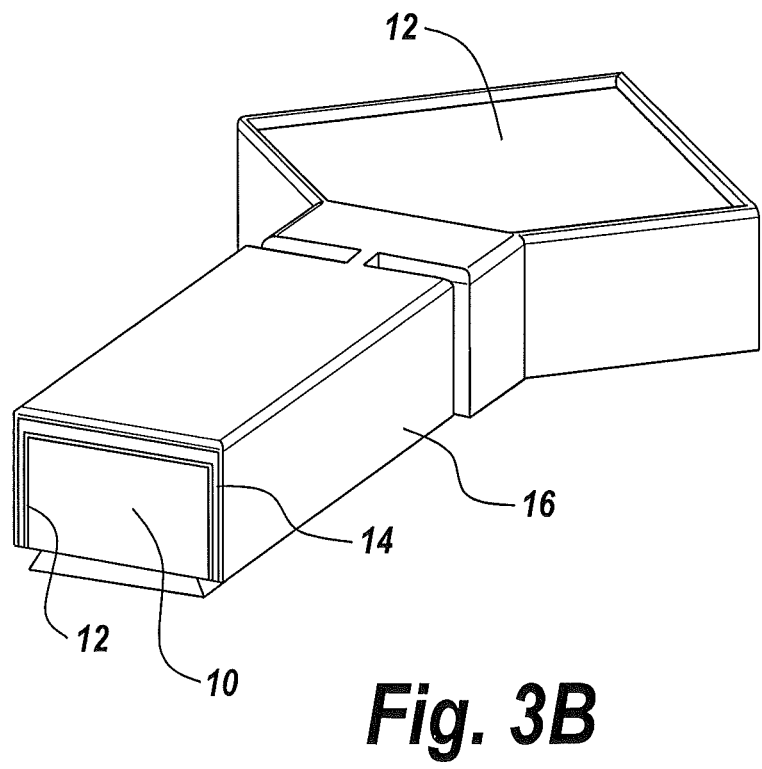

Methods of forming the microelectromechanical resonator of FIG. 1 according to some embodiments of the invention are illustrated by FIGS. 3a-3b. In particular, FIG. 3A illustrates a step of patterning a semiconductor active layer of a semiconductor-on-insulator (SOI) substrate to define a resonator body 10, which extends on an underlying buried insulating layer 20 of the SOI substrate. This patterning step may be performed by selectively etching the semiconductor active layer and buried insulating layer 20 using a photolithographically defined etching step, which exposes portions of the underlying substrate and may cause some degree of undercutting of the buried insulating layer from underneath the resonator body 10. Thereafter, as illustrated by FIG. 3B, the upper surface and sidewalls of the resonator body 10 are coated with a composite of layers, including a bottom electrode layer 12 (e.g., molybdenum), a piezoelectric layer 14 (e.g., aluminum nitride) on the bottom electrode layer 12 and a top electrode layer 16 (e.g., molybdenum) on the piezoelectric layer 14. In particular, the piezoelectric layer 14 may be deposited as a sputtered aluminum nitride layer that extends on the upper surface and the sidewall of the resonator body 10. In some embodiments of the invention, the aluminum nitride layer may be deposited so that its C-axis is perpendicular to the sidewalls of the resonator body 10. The piezoelectric layer 14 may alternatively be formed of zinc oxide (ZnO) or lead zirconate titanate (PZT), for example.

Figure 4:
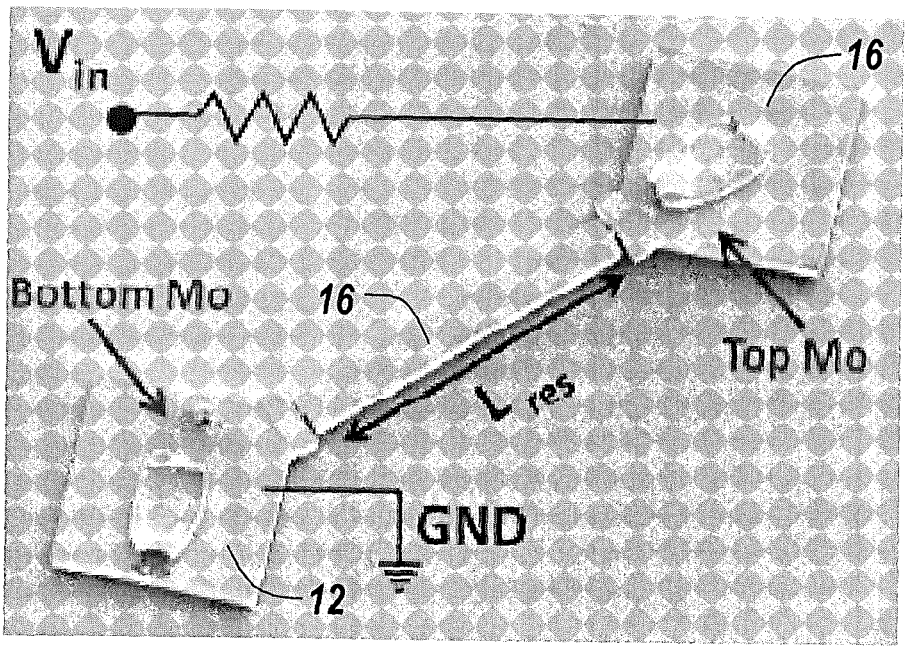
FIG. 4 is an SEM photograph of a microelectromechical resonator with an illustrated electrical interface scheme, according to an embodiment of the present invention.

As illustrated, after the buried insulating layer 20 is removed, the resonator body 10 is released opposite an opening in the buried insulating layer 20 and becomes anchored by at least one tether to a surrounding substrate, which may also be covered by the bottom electrode 12, the single piezoelectric layer 14 and the top electrode 16. As further illustrated by FIG. 3B, electrical contact to the bottom electrode 12 may be provided by selectively etching portions of the top electrode 16 and piezoelectric layer 14 from a portion of the surrounding substrate. Thus, as illustrated by FIG. 4, which is an SEM photograph of a microelectromechical resonator (having a length "$L_{res}$") with an illustrated electrical interface scheme, the microelectromechanical resonator may be utilized as a one-port resonator by electrically connecting the bottom electrode 12 to a reference voltage (e.g., GND) and electrically connecting the top electrode 16 to a terminal (e.g., Vin) of an oscillator circuit.

Figure 5:
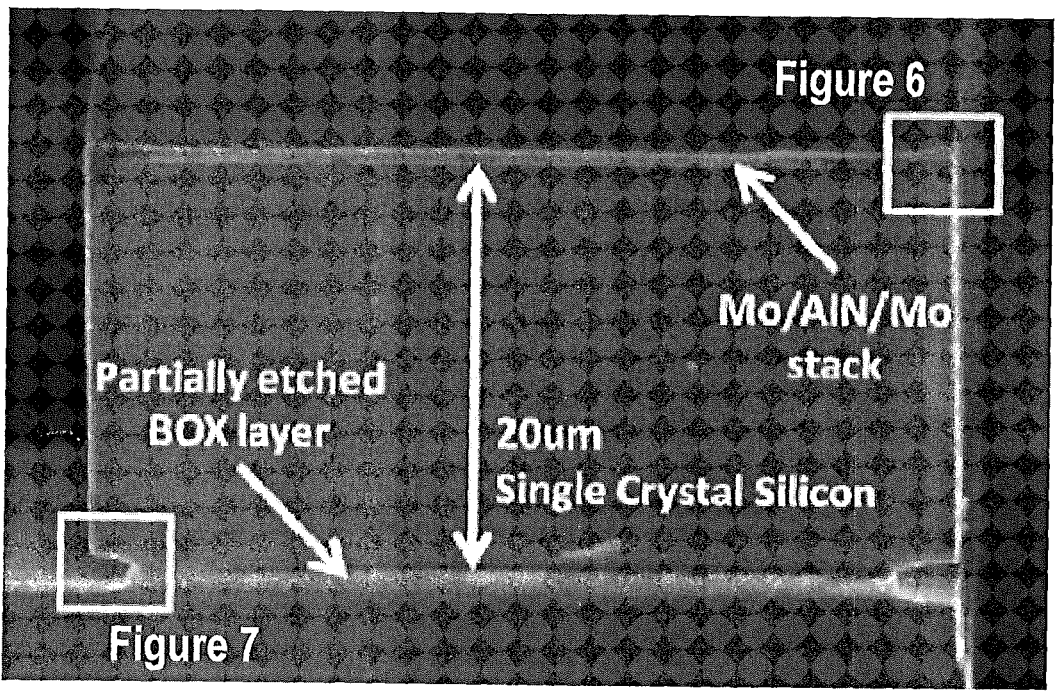
FIG. 5 is an SEM photograph of a cross-section of a microelectromechanical resonator, according to an embodiment of the present invention.
Figure 6:
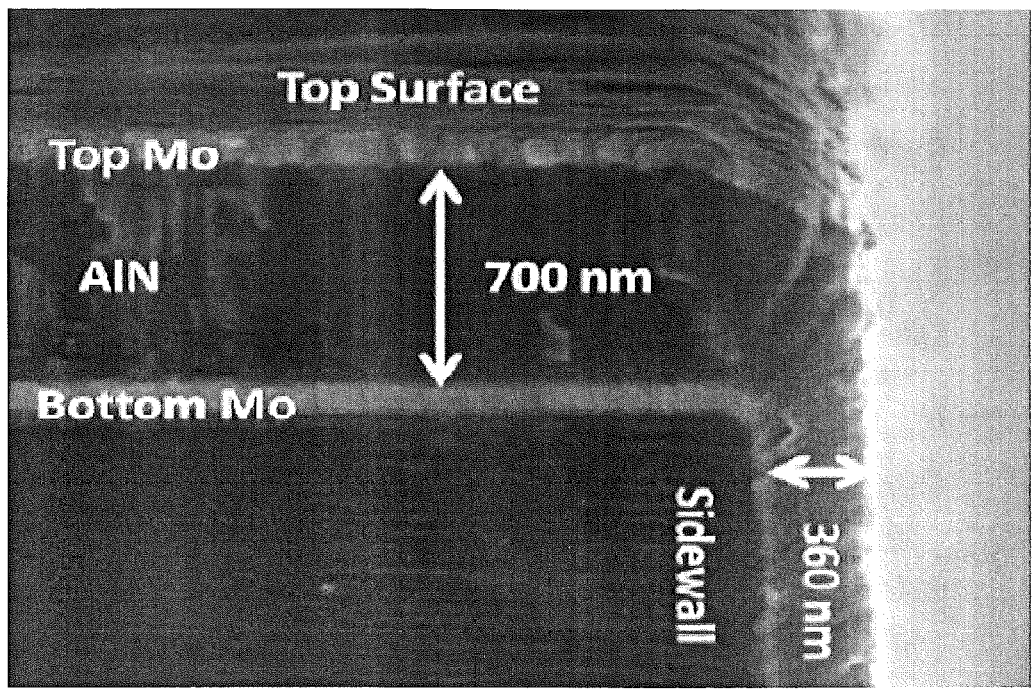
FIG. 6 is an SEM photograph showing an enlarged cross-sectional view of an upper right corner of the microelectromechanical resonator of FIG. 5.
Figure 7:
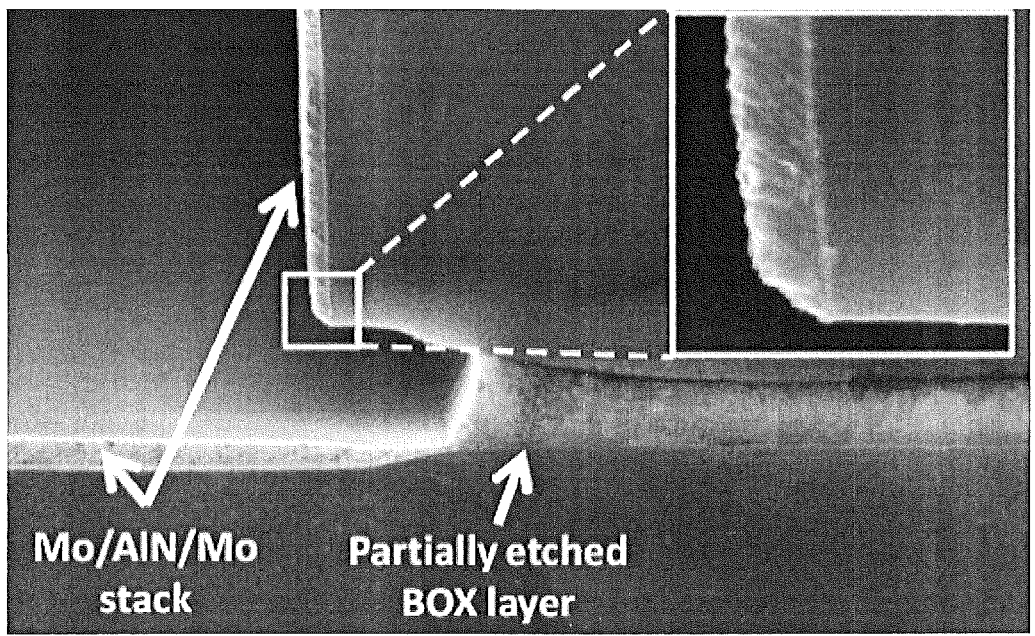
FIG. 7 is an SEM photograph showing an enlarged cross-sectional view of a lower left corner of the microelectromechanical resonator of FIG. 5.

FIGS. 5-7 illustrate SEM photographs of a cross-section of a microelectromechanical resonator according to an embodiment of the present invention. As shown by FIG. 5, a single crystal silicon resonator body having a thickness of 20 um is provided with a composite stack of Mo/AlN/Mo thereon. The buried oxide layer (BOX) is also shown as being partially etched to enable full release of the resonator body when the buried oxide layer is subsequently removed using an HF solution. FIG. 6 shows the continuity of AlN and Mo layers from the top surface to sidewalls at the edges of the resonator, with the sidewall AlN thickness being about one-half the thickness of the top surface AlN. The bottom Mo layer serves as the ground for the sidewall and top AlN layers. FIG. 7 illustrates the quality and uniformity of the Mo/AlN/Mo stack on the bottom sidewall of the resonator body, which results in efficient actuation of a desired width-extensional resonance mode over an entire thickness of the resonator and inhibits charge cancellation in the sensing mechanism.

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:

1. A microelectromechanical resonator, comprising:
a resonator body having a first piezoelectric layer on a upper surface thereof configured to support both actuation and sensing through a piezoelectric effect and a second piezoelectric layer on at least a first sidewall thereof configured to support both actuation and sensing through a piezoelectric effect, said first and second piezoelectric layers contiguous as a single piezoelectric layer extending from the first sidewall onto at least a portion of the upper surface;
a top electrode on the single piezoelectric layer; and
a bottom electrode extending between the single piezoelectric layer and the first sidewall of said resonator body, which is anchored on opposing ends thereof to a surrounding substrate by at least one tether.

2. The resonator of claim 1, wherein the single piezoelectric layer is a sputtered aluminum nitride layer.

3. The resonator of claim 1, wherein the single piezoelectric layer comprises a material selected from a group consisting of zinc oxide and lead zirconate titanate.

4. The resonator of claim 1, wherein the at least one tether is covered by the bottom electrode, the single piezoelectric layer and the top electrode.

5. The resonator of claim 2, wherein a C-axis of the sputtered aluminum nitride layer is perpendicular to the first sidewall of said resonator body.

6. The resonator of claim 1, wherein the bottom electrode directly contacts the first sidewall, the upper surface and a second sidewall of said resonator body.

7. The resonator of claim 6, wherein the top electrode extends opposite the first sidewall, the second sidewall and the upper surface of said resonator body.

8. The resonator of claim 1, wherein the top electrode extends opposite the first sidewall and the upper surface of said resonator body.

9. A method of forming a microelectromechanical resonator, comprising:
forming a resonator body;
forming a bottom electrode on a pair of opposing sidewalls and an upper surface of the resonator body;
coating the bottom electrode on the sidewalls and the upper surface of the resonator body with a piezoelectric layer; and
forming a top electrode on the piezoelectric layer;
wherein said forming a resonator body comprises patterning a semiconductor active layer of a semiconductor-on-insulator substrate by selectively etching the semiconductor active layer for a sufficient duration to expose an underlying buried insulating layer within the substrate; and
wherein said forming a top electrode is followed by a step of selectively removing a portion of the buried insulating layer extending underneath the resonator body to thereby cause the resonator body to be suspended over an opening in the buried insulating layer.

10. A method of forming a microelectromechanical resonator, comprising:
forming a resonator body anchored to a surrounding substrate by at least one tether;
forming a bottom electrode on a pair of opposing sidewalls and an upper surface of the resonator body;
coating the bottom electrode on the sidewalls and the upper surface of the resonator body with a piezoelectric layer; and
forming a top electrode on the piezoelectric layer.

11. The method of claim 10, wherein said coating comprises sputter depositing the piezoelectric layer onto the bottom electrode.

12. A one-port micromechanical resonator, comprising:
a resonator body anchored to a surrounding substrate by at least one tether, said resonator body having an upper surface and opposing sidewalls covered by a composite stack of a bottom electrode, a piezoelectric layer and an upper electrode.

13. The resonator of claim 12, wherein a first thickness of the piezoelectric layer on the sidewalls of said resonator body is thinner than a second thickness of the piezoelectric layer on the upper surface of said resonator body.

14. The resonator of claim 13, wherein the first thickness is about one-half the second thickness.

15. The resonator of claim 12, wherein a portion of the piezoelectric layer on the upper surface of said resonator body is configured to support actuation and sensing through a transverse piezoelectric effect and a portion of the piezoelectric layer on the sidewalls of said resonator body is configured to support actuation and sensing through a longitudinal piezoelectric effect.

16. The resonator of claim 12, wherein said resonator body comprises single crystal silicon; wherein the bottom and top electrodes comprise molybdenum; and wherein the piezoelectric layer comprises aluminum nitride.

17. The resonator of claim 16, wherein the piezoelectric layer is a sputtered aluminum nitride layer.

18. The resonator of claim 17, wherein a C-axis of the sputtered aluminum nitride layer is perpendicular to a sidewall of said resonator body.

* * * * *